United States Patent
Anikitchev et al.

(10) Patent No.: US 7,300,809 B2
(45) Date of Patent: Nov. 27, 2007

(54) OPTICALLY PUMPED EDGE-EMITTING SEMICONDUCTOR LASER

(75) Inventors: Serguei G. Anikitchev, Belmont, CA (US); Hailong Zhou, Milpitas, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 313 days.

(21) Appl. No.: 11/194,000

(22) Filed: Jul. 29, 2005

(65) Prior Publication Data

US 2005/0277215 A1    Dec. 15, 2005

Related U.S. Application Data

(63) Continuation of application No. 10/767,420, filed on Jan. 29, 2004, now Pat. No. 6,947,466.

(51) Int. Cl.
     *H01L 21/00*     (2006.01)
     *H01S 3/091*     (2006.01)

(52) U.S. Cl. ........................................... 438/22; 372/70

(58) Field of Classification Search ................... 372/70, 372/43; 438/22; 257/13, 79
See application file for complete search history.

(56) References Cited

U.S. PATENT DOCUMENTS

| | | | |
|---|---|---|---|
| 5,513,204 A | 4/1996 | Jayaraman | 372/96 |
| 6,252,896 B1 | 6/2001 | Tan et al. | 372/50 |
| 6,258,704 B1 | 7/2001 | Turner | 438/613 |
| 6,339,607 B1 | 1/2002 | Jiang et al. | 372/50 |
| 6,424,669 B1 | 7/2002 | Jiang et al. | 372/50 |
| 6,434,180 B1 | 8/2002 | Cunningham | 372/50 |
| 6,448,642 B1 | 9/2002 | Bewley et al. | 257/719 |
| 6,714,574 B2 * | 3/2004 | Clayton et al. | 372/50.1 |
| 6,947,466 B2 * | 9/2005 | Anikitchev et al. | 372/75 |
| 2001/0043636 A1 | 11/2001 | Bewley et al. | 372/70 |
| 2002/0001328 A1 * | 1/2002 | Albrecht et al. | 372/50 |
| 2002/0075935 A1 * | 6/2002 | Clayton | 372/75 |
| 2003/0026312 A1 * | 2/2003 | Clayton et al. | 372/50 |
| 2005/0008056 A1 * | 1/2005 | Albrecht et al. | 372/50 |
| 2006/0039437 A1 * | 2/2006 | Albrecht et al. | 372/70 |

FOREIGN PATENT DOCUMENTS

| | | |
|---|---|---|
| WO | WO 00/62384 | 10/2000 |
| WO | WO 01/13481 A1 | 2/2001 |
| WO | WO 01/33678 A1 | 5/2001 |
| WO | WO 01/59895 A1 | 8/2001 |
| WO | WO 01/93386 A1 | 12/2001 |
| WO | WO 02/067393 A1 | 8/2002 |
| WO | WO 02/075879 A1 | 9/2002 |

* cited by examiner

*Primary Examiner*—Don Wong
*Assistant Examiner*—Hung Tran Vy
(74) *Attorney, Agent, or Firm*—Stallman & Pollock LLP (57) ABSTRACT

A multilayer semiconductor laser includes a substrate on which is formed a semiconductor multilayer heterostructure divided into a plurality of electrically pumped regions and an elongated optically pumped region. The electrically pumped regions generate and deliver optical pump radiation laterally into the elongated optically pumped region. Output radiation is generated and delivered by the optically pumped region.

17 Claims, 7 Drawing Sheets

OPTICALLY PUMPED EDGE-EMITTING SEMICONDUCTOR LASER

CLAIM OF PRIORITY

This application is a continuation of U.S. patent application Ser. No. 10/767,420, entitled "OPTICALLY PUMPED EDGE-EMITTING SEMICONDUCTOR LASER," to Serguei Anikitchev, et al., filed Jan. 29, 2004 now U.S. Pat. No. 6,947,466, which is hereby incorporated herein by reference.

TECHNICAL FIELD OF THE INVENTION

The present invention relates generally to semiconductor lasers. The invention relates in particular to an edge-emitting semiconductor laser laterally optically pumped by a plurality of electrically pumped semiconductor lasers.

BACKGROUND

Figure 1A:
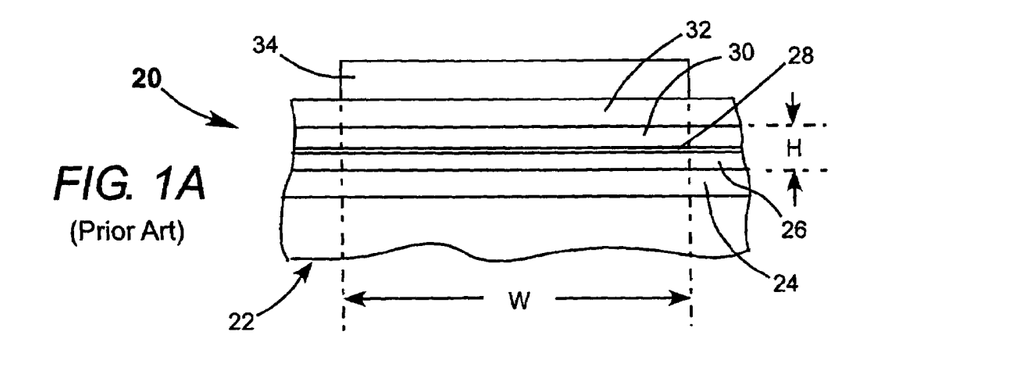
FIG. 1A is an end elevation view schematically illustrating details and general dimensions of a prior-art separate confinement heterostructure diode-laser including a quantum well layer bounded by upper and lower optical confinement or waveguide layers, the waveguide layers being bounded by upper and lower electrical confinement or cladding layers, and the diode-laser including an elongated rectangular electrode on the upper cladding layer for passing an energizing current through the diode-laser, the electrode having a length equal to the length of the diode-laser.
Figure 1B:
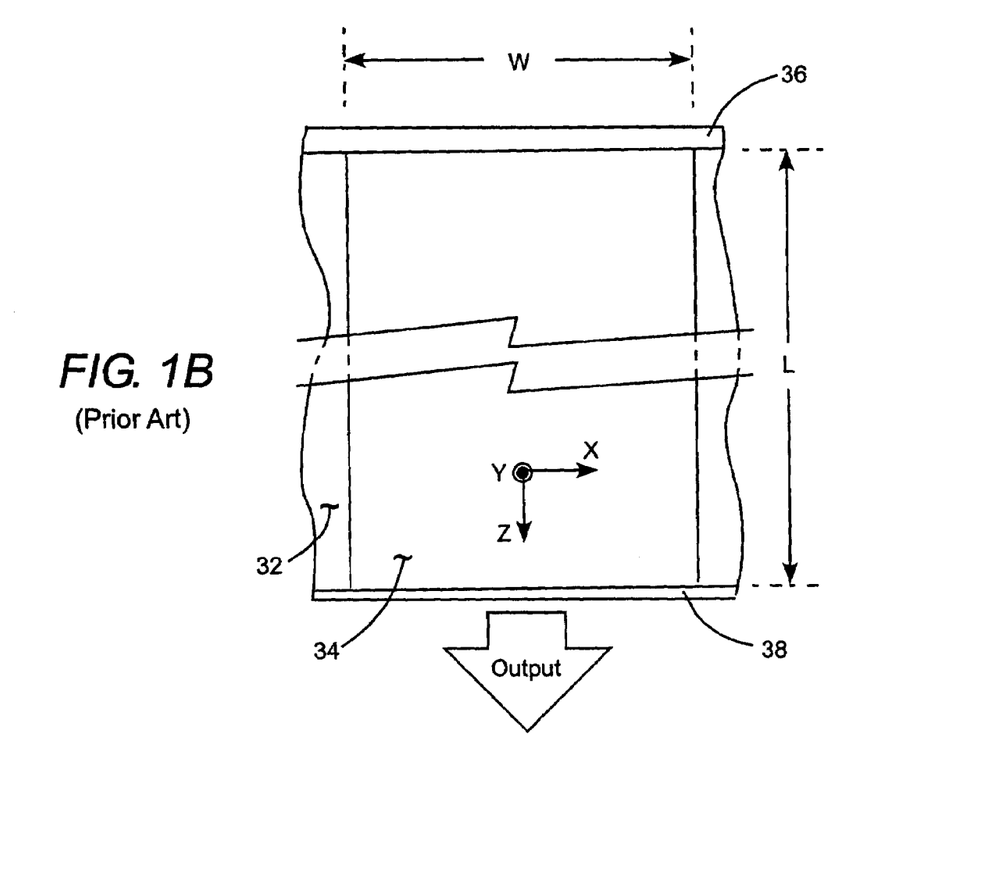
FIG. 1B is a plan view from above of the laser of FIG. 1A.

Referring now to the drawings, wherein like features are designated by like reference numerals, FIG. 1 schematically illustrates one common type of prior-art, edge-emitting, separate-confinement-heterostructure, diode-laser 20 formed by epitaxially growing a series of semiconductor layers on an n-doped, semiconductor substrate 22. A lower electrical confinement or cladding layer 24 of the diode-laser is an n-doped semiconductor layer. Surmounting the lower cladding layer is a lower optical confinement or waveguide layer 26, an undoped semiconductor layer. Surmounting the lower waveguide layer is a quantum-well 28, also an undoped semiconductor layer. The active layer is surmounted by an upper waveguide layer 30, similar to lower waveguide layer 26. Upper waveguide layer 30 is surmounted in turn by an upper cladding layer 32, a p-doped semiconductor layer.

An elongated, rectangular electrode 34 is bonded to upper cladding layer 32. Electrode 34 extends the entire length (L) of the diode-laser. The width W and length L of the electrode define the width and length of the diode-laser. The electrode and the region under the electrode are often referred to by practitioners of the art to as a "stripe".

The diode-laser is energized (electrically pumped) by passing current through the layers between electrode 34 and substrate 22. Mirrors 36 and 38 on the ends (facets) of the laser form a laser resonant cavity. Energizing the laser generates electrical carriers that recombine in the quantum-well to provide laser radiation that circulates in the resonant cavity. Laser radiation is emitted from the diode-laser in a general direction along a longitudinal (Z) axis of the laser. The radiation is emitted as a diverging beam (not shown) having a greater divergence in the Y-axis than in the X-axis. For this reason, the Y-axis and X-axis are respectively referred to as the fast and slow axes by practitioners of the art.

Laser radiation circulating in the laser cavity is confined in the thickness (Y-axis) direction of the layers by reflection from interfaces between the waveguide regions and the cladding regions adjacent thereto. The circulating radiation is confined in the width (X-axis) direction, among other factors, by the width of the electrode, as it is only in this width that there is optical gain.

This type of diode-laser typically has a stripe-length between about 1.0 and 1.5 millimeters (mm), and emits radiation from an emitting aperture (corresponding to the ends of layers 26, 28, and 30 covered by electrode 34) having a height H of about 1.0 micrometer ($\mu$m) and a width W between about 4.0 and 200 $\mu$m. The emitting aperture height H includes the combined thickness of the upper and lower waveguide layers 30 and 26 and the quantum well layer 28. Width W is usually referred to in the art as the emitter-width or stripe-width. A diode-laser having an emitter-width greater than about 30 $\mu$m is often referred to as a wide-emitter diode-laser.

Generally, for a given length of a diode-laser, the greater the stripe (emitter) width, the greater will be the potential output power of the diode-laser. However, the wider the stripe width, the greater is the number of transverse modes at which the laser delivers output radiation. The greater the number of transverse modes, the poorer is the quality of the output beam of the diode-laser. While a multiple transverse mode output beam is acceptable for diode-laser applications such a heating and surface treatment, it is often not suitable for applications in which the output beam must be focused into a small spot, for example in end-pumping a fiber laser.

In a co-pending U.S. patent application Ser. No. 10/643,621, filed Aug. 19, 2003, assigned to the assignee of the present invention, a cause of the multiple transverse mode output of a wide stripe separate confinement heterostructure laser is identified as an uneven distribution of temperature across the width, i.e., in the X-axis direction, of the diode-laser. This uneven distribution or thermal gradient results from the passage of current through the laser stripe region. This thermal gradient is such that it causes a thermally induced phase curvature in the waveguide regions.

Figure 2:
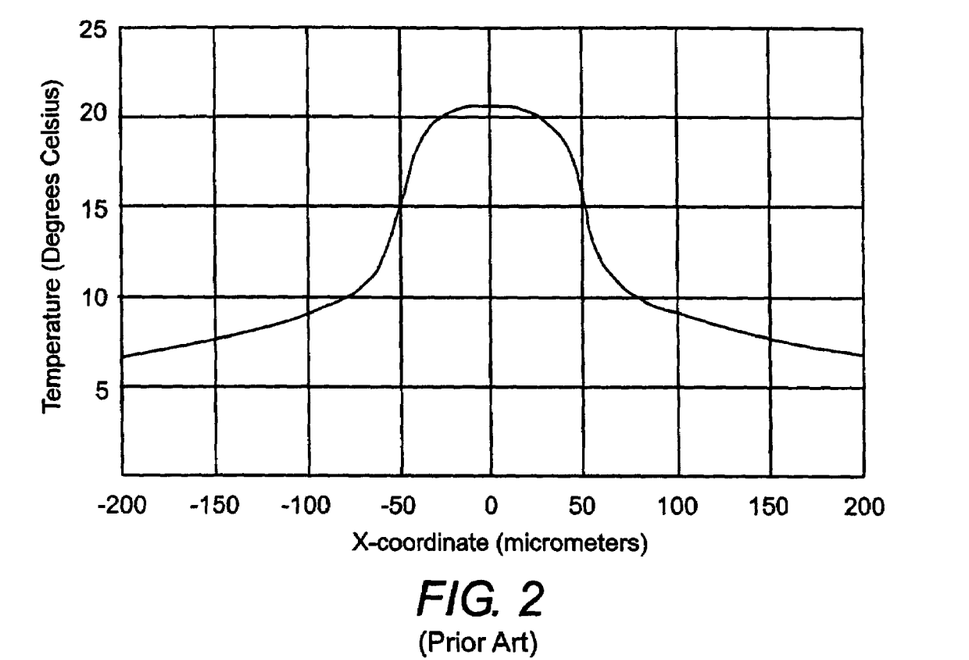
FIG. 2 illustrates computed temperature variation during operation across the width of the diode-laser of FIG. 1.

A computed, exemplary, such temperature distribution is schematically depicted, graphically, in FIG. 2. In this calculated example, it is assumed that the diode-laser is a semiconductor structure indium-soldered to a cooper heat-sink, the electrode has a width of 100 $\mu$m, and that 4 watts of current are passed through the diode-laser. The temperature peaks in the center (X=0) of the diode-laser stripe, i.e., on the Z-axis, and reduces towards the edges. This temperature distribution causes a corresponding refractive index variation across the width of the diode-laser. The refractive index distribution causes a phase curvature in the X-axis for radiation circulating in the waveguide regions of the laser.

Figure 3:
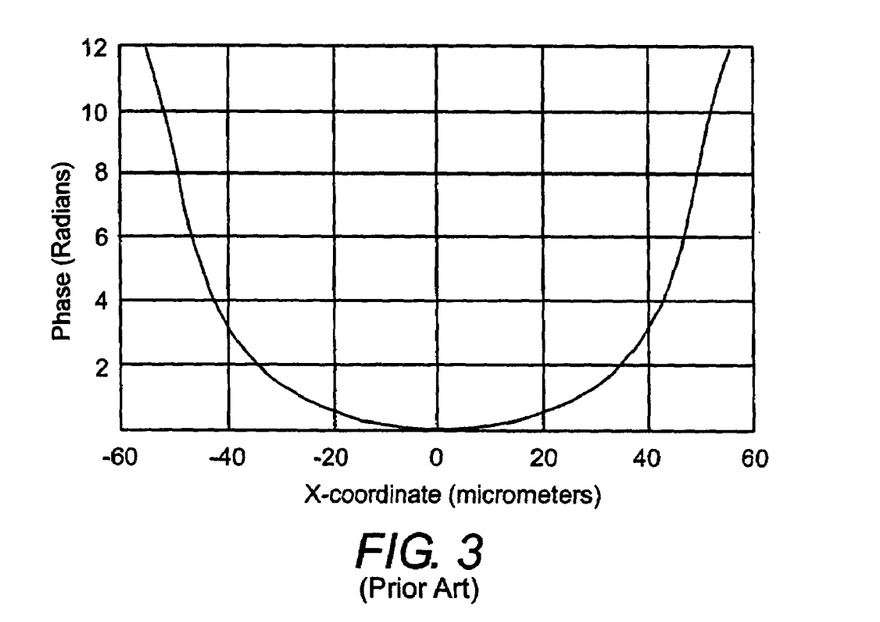
FIG. 3 schematically illustrates computed phase curvature of output radiation resulting from the temperature variation of FIG. 1.

A computed example of this phase curvature as a function of X-axis position is schematically, graphically depicted in FIG. 3. This phase curvature results in a 100-$\mu$m length of the laser having a dioptric power of about 0.033 $mm^{-1}$, equivalent to a converging lens with a focal length of about 30.0 mm. Accordingly, the 1.0 mm length of the diode-laser provides the equivalent of a converging lens with a focal length of about 3.0 mm. A result of this thermally induced lens is that the fundamental operating mode of the laser is constrained to a relatively narrow central portion of the total width of the laser (the stripe width). This leaves gain in the remaining portions of the laser width available to support higher order operating modes, i.e., to support multiple transverse mode operation.

There is a need for a method of energizing a wide stripe, edge-emitting, separate confinement heterostructure semiconductor laser that does not provide the above discussed positive lens effect and allows the laser to operate in a single transverse mode.

BRIEF SUMMARY

In one aspect, a semiconductor laser in accordance with the present invention comprises a substrate having a multi-layer semiconductor heterostructure formed thereon. The heterostructure is divided into an elongated first region and a plurality of electrically pumped second regions. The first region is optically pumped by radiation having a first wavelength, the radiation being generated and deposited laterally into the optical pumped radiation by the electrically pumped regions. The optically pumped first region is in a laser resonator and generates radiation having a second wavelength longer than the first wavelength in response to the optical pumping. The second wavelength radiation is delivered as output radiation from one end of the optically pumped region.

In preferred embodiments of the inventive laser there are electrically pumped regions on both sides of the optically pumped regions. Heat generated by the electrically pumped regions causes a temperature gradient across the optically pumped region, with temperature being higher at the edges of the optically pumped region. This is the opposite of the temperature gradient discussed above in prior-art wide stripe lasers, and can minimize if not altogether eliminate the generation of laser radiation in modes other than the fundamental mode.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION

Figure 4A:
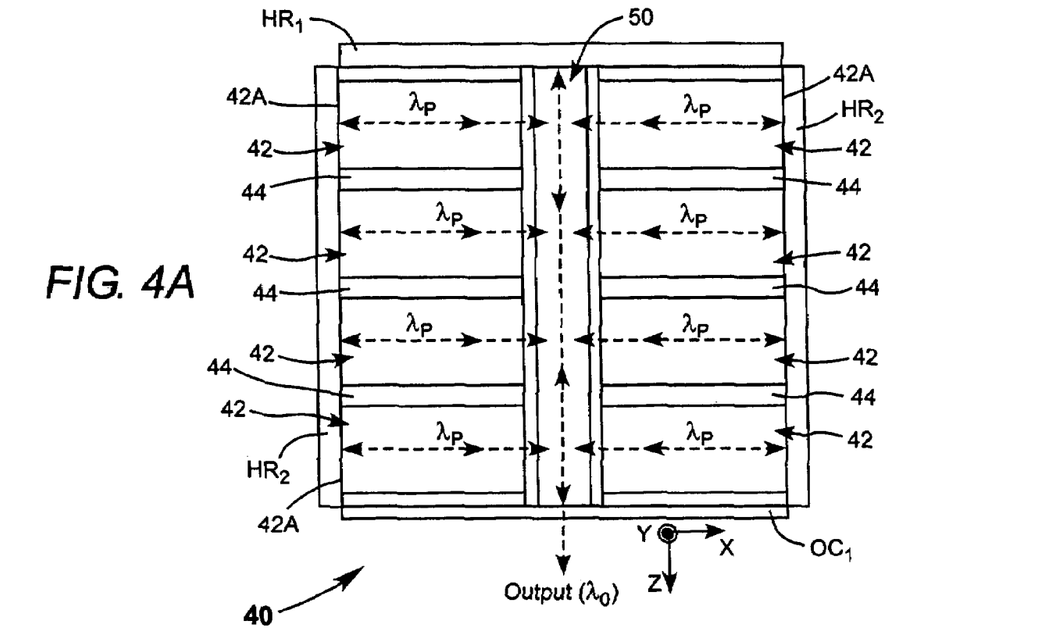
FIG. 4A is a plan view from above schematically illustrating one preferred embodiment of a wide stripe, optically pumped, edge-emitting laser in accordance with the present invention including a wide stripe optically-pumped edge-emitting region laterally optically pumped from two sides by a plurality of electrically-pumped regions each thereof having a layer structure identical with that of the optically-pumped region.
Figure 4B:
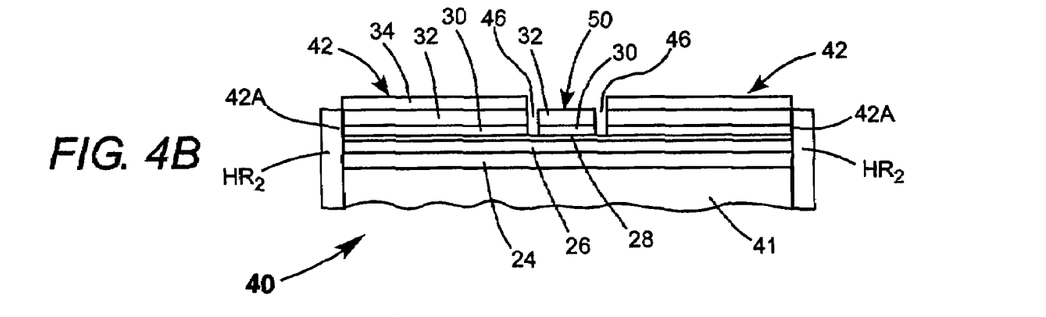
FIG. 4B is an end elevation view schematically illustrating separation between the electrically and optically pumped regions of the laser of FIG. 4A.
Figure 4C:
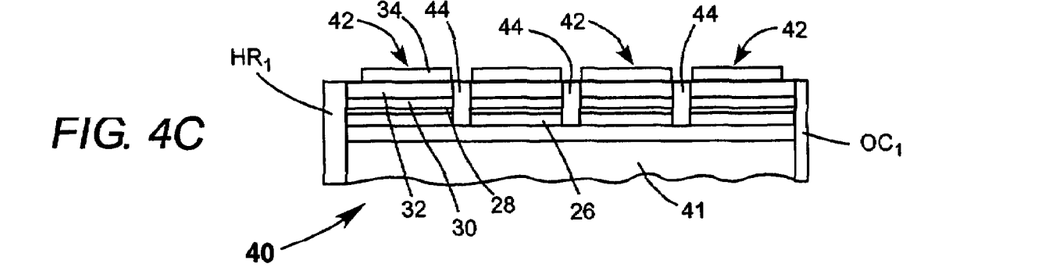
FIG. 4C is a side elevation view schematically illustrating separation between the electrically pumped regions of the laser of FIG. 4A.

Continuing with reference to the drawings, wherein like features are designated by like reference numerals, FIGS. 4A-C schematically illustrate a preferred embodiment 40 of an optically pumped, edge-emitting laser in accordance with the present invention. The laser has X and Y and Z-axes corresponding with those of the above-described prior-art laser. In laser 60, upper and lower cladding layers 32 and 24 respectively, upper and lower waveguide layers 30 and 26 respectively, and a quantum well layer 28 are grown on a substrate 41, initially as layers extending all over the substrate. A plurality, here, eight, of electrically pumped regions 42 is formed by etching grooves 44 parallel to the X-axis of the laser, and grooves 46 parallel to the Z-axis of the laser. Grooves 44 and 46 are etched such that they have a depth extending at least through upper cladding layer 32 and upper waveguide layer 30. Grooves 44 are preferably etched such that they have a depth extending at least through the lower waveguide layer 26, and more preferably through all of the layers.

Each electrically pumped region 42 is surmounted by an electrode layer 34. In a preferred method of fabrication, the electrode layer is formed over the entire heterostructure and then etched to form the electrodes of the electrically pumped regions. The electrically pumped regions are activated by passing a current through the regions from electrode layers 34 to substrate 41. Laser radiation is generated by the passage of current through the layers. Groove 46 provides a sufficient discontinuity in the effective refractive index of the layers to provide feedback of a portion of the radiation, and accordingly acts as a low reflectivity resonator-mirror. Quantum well layer 28 is formulated to be capable of providing optical gain in a predetermined band of wavelengths having a peak gain within the band. A multilayer coating $HR_2$ on outward facing ends 42A of regions 42 provides high (preferably greater than 99%) reflectivity over a range of wavelengths on the short wavelength side of the peak of the optical gain band, and provides low (preferably less that 5%) reflectivity in a wavelength region including the peak gain wavelength and longer wavelengths. Because of this, each of the electrically pumped regions 42 functions as an individual diode-laser having a resonator formed between the mirror $HR_2$ and groove 46. Each region or diode-laser emits laser radiation having a wavelength $\lambda_P$ on the short wavelength side of the peak gain wavelength. This radiation is delivered into an elongated region 50 of the laser between grooves 46. This region 50 provides the optically pumped region of the laser. Region 50 is optically pumped by the radiation $\lambda_P$ delivered laterally, i.e., along the X-axis, into the optically pumped region by electrically pumped regions (diode-lasers) 42 as indicated schematically in FIG. 4A. A portion of the optical pump radiation is absorbed in region 50 to provide the optical pumping. Electrically pumped sections 42 operate in multiple transverse modes. In the inventive laser, this is advantageous, even desirable, as it provides for a relatively uniform distribution of pump radiation $\lambda_P$ in optically pumped region 50.

Here it should be noted that the X, Y, and Z axes of laser 40 are defined by the slow (width), fast (height) and longitudinal (propagation) axes of optically pumped region 50 as it circulates through this region. However as electrically pumped regions 42 are arranged perpendicular to, i.e., with their propagation axes perpendicular to, optically pumped region 50, the X, Y, and Z axes of laser 40 correspond with the longitudinal (propagation), fast (height), and slow (width) axes of electrically pumped regions 42.

Deposited on one end of optically pumped region 50 is a multilayer high reflecting mirror coating $HR_1$. Mirror $HR_1$ provides high (preferably greater than 99%) reflectivity over a band of wavelengths including the peak gain wavelength. On the opposite end of optically pumped region 50 is a multilayer coating $OC_1$. This coating is configured to function as an output coupling mirror for optically pumped region, and preferably has a reflectivity between about 8% and 40% at about the peak gain wavelength. A laser resonator is formed between mirrors $HR_1$ and $OC_1$. Laser radiation having a wavelength $\lambda_0$ at or close to the peak-gain wavelength circulates in this resonator (generally along the Z-axis) and is delivered as output radiation via mirror $OC_1$. A primary purpose of providing a low reflection at the peak gain wavelength is to prevent electrically pumped regions from generating any radiation at wavelength $\lambda$ and depleting the output of the laser. Grooves 44 prevent electrically pumped regions 42 from generating laser radiation in the Z-axis direction of laser 40 at any wavelength. In the preferred fabrication method, the optical coatings $HR_1$, $HR_2$ and $OC_1$ are added after etching the heterostructure.

Figure 5:
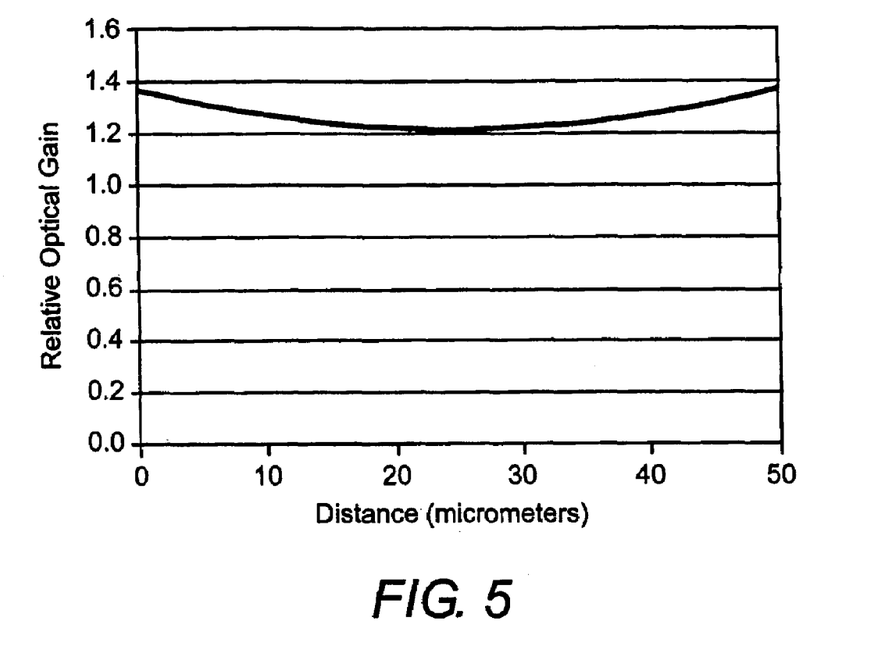
FIG. 5 is a graph schematically illustrating computed optical gain across the optically pumped region of one example of the laser of FIG. 4 wherein the optically pumped region has a width of about 50 micrometers.
Figure 6:
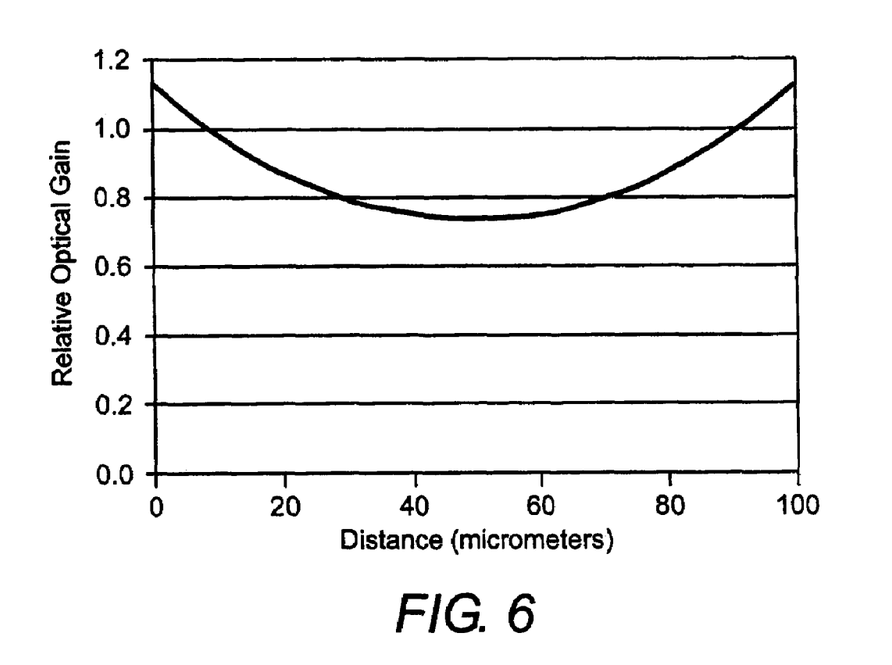
FIG. 6 is a graph schematically illustrating computed optical gain across the optically pumped region of another example of the laser of FIG. 4 wherein the optically pumped region has a width of about 100 micrometers.
Figure 7:
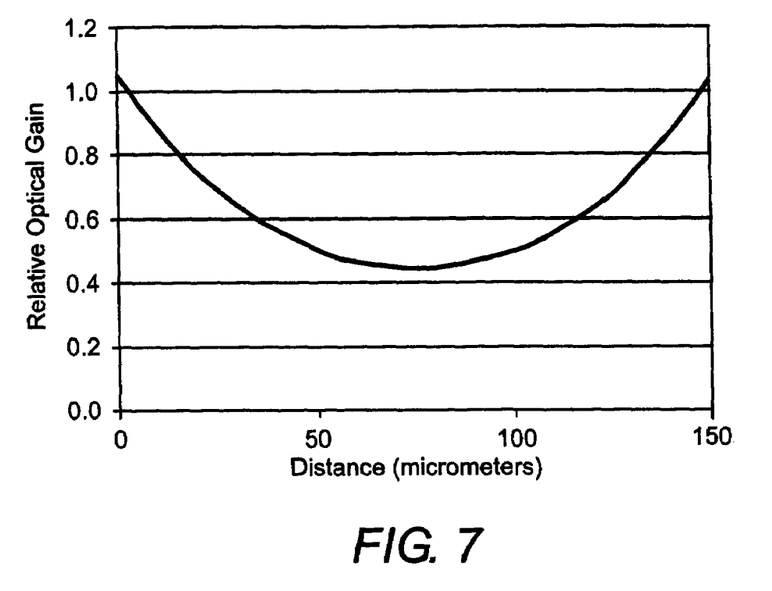
FIG. 7 is a graph schematically illustrating computed optical gain across the optically pumped region of yet another example of the laser of FIG. 4 wherein the optically pumped region has a width of about 150 micrometers.

Calculations indicate that the 1/e absorption length of pump radiation $\lambda_P$ in optically pumped region 50 is about 50.0 micrometers (μm) assuming an indium gallium arsenide (InGaAs) quantum-well material. This provides that optically pumped region 50 can have a width between about 50.0 and 150.0 μm or greater, in other words region 50 can be described as a wide stripe region. FIG. 5, FIG. 6, and FIG. 7 schematically illustrate computed optical gain as a function of stripe width (X-axis width) of optically pumped region 50 for stripe widths of 50.0 μm, 100.0 μm, and 150.0 μm, respectively. In each case, there is a higher gain at the edges of the optically pumped "stripe". Absent any compensating effect, such gain distribution would favor oscillation of high order lateral modes. Optically pumped section 50, however, is heated by conduction of heat from electrically pumped sections 42. This creates a temperature distribution across optically pumped region 50 that provides a higher temperature at the edges of the region that at the center, i.e., the opposite of the temperature distribution in the above-described prior-art laser. The temperature difference between center and edges increases with increasing width and accordingly with increasing gain difference between center and edges. This form of temperature difference provides an X-axis negative lens effect in region 50. The negative lens effect expands the fundamental mode of oscillation in region 50 to fill the region, thereby making use of the higher gain at the edges of the region, preventing oscillation of higher order transverse modes and encouraging single lateral mode operation of the wide stripe region, a primary object of the present invention.

Figure 8:
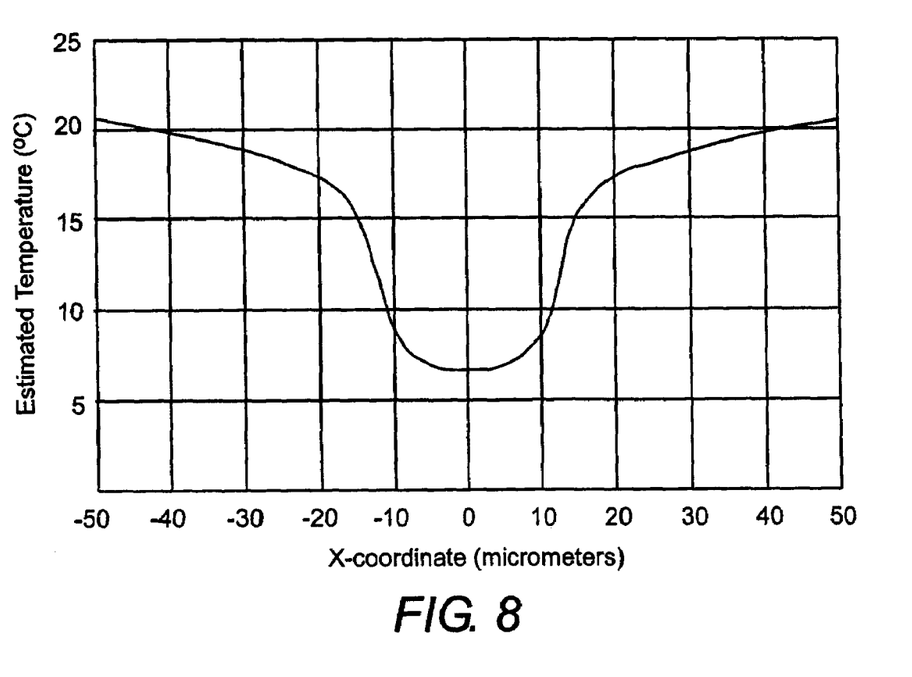
FIG. 8 is a graph schematically illustrating an estimated temperature across the optically pumped region of the laser of FIG. 6.

FIG. 8 is a graph schematically depicting estimated X axis temperature gradient across the optically pumped region in one example of a laser 40 in accordance with the present invention in which optically pumped region 50 has a width of 100 μm. In this gradient, temperature at the edges of the optically pumped region is higher than the temperature at the center. The provides a negative lens effect in the optically pumped region that causes the fundamental mode to fill the region and at least minimize if not altogether eliminate the generation of higher order modes.

Figure 9:
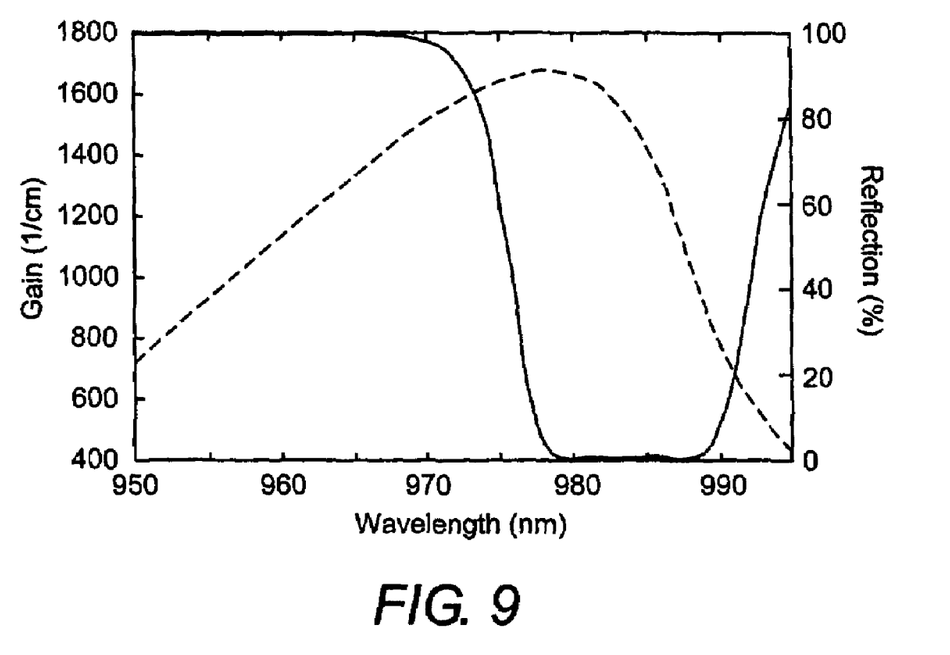
FIG. 9 is a graph schematically illustrating relative optical gain as function of wavelength for the laser of FIG. 6 and schematically illustrating reflection as a function of wavelength for a multilayer mirror suitable for the electrically pumped regions of the laser.

FIG. 9 schematically illustrates predicted relative gain as a function of wavelength, i.e., the gain bandwidth, (dashed curve) for the quantum-well layer of a laser in accordance with the present invention, and reflection as a function of wavelength for one example of a multilayer mirror $HR_2$ for electrically pumped regions 42. The quantum well layer material is assumed to be InGaAs. The peak gain wavelength is about 980 nanometers (nm). Mirror $HR_2$ has less than 1% reflectivity at the peak gain wavelength and reaches about 99.9% reflectivity at a wavelength of about 965 nm. It is estimated that $\lambda_P$, the wavelength of pump radiation delivered to optically pumped region 50 by electrically pumped regions 42, would be between about 960 and 965 nm. The output wavelength $\lambda_0$ of the inventive laser would be about the peak gain wavelength of 980 nm.

The example of mirror $HR_2$ in FIG. 9 is assumed to include 43 layers alternately of titanium dioxide ($TiO_2$—having a refractive index of about 2.25) and silicon dioxide ($SiO_2$—having a refractive index of about 2.25). Generally, for a given number of layers of a particular high refractive index material and a particular low refractive index material, increasing the width of the low reflection region will reduce the steepness of the transition from the low reflection region to the high reflection region. The steeper the transition from the high reflection region to the low reflection region, the higher will be the efficiency of operation of the electrically pumped regions 42 consistent with having laser output as close to the peak gain wavelength as possible. Mirror coatings of the type exemplified in FIG. 9 are commercially available to custom specification from Coherent Inc., of Santa Clara, Calif., and other optical service providers.

Examples of preferred dimensions in the inventive laser are as follows. The length of optically pumped region 50, i.e., the Z-axis dimension, is preferably about 1.5 millimeters (mm). The distance along the electrically pumped regions 42, between mirrors $HR_2$, i.e., the X-axis dimension, is preferably about 2.0 mm. The width of grooves 44 and 46 is preferably about 10.0 μm. Electrodes 34 are preferably slightly narrower than the regions defined by grooves such that the lateral distance between the electrodes is greater than the width of the grooves. By way of example, for a groove width of 10.0 μm, a preferred electrode spacing is about 25.0 μm. It is estimated that optical pumping efficiency can be as high as 70%, with overall laser efficiency of the laser being between about 25% and 35%, assuming and electrical-to-optical conversion efficiency in electrically pumped regions 42 of between about 40% and 50%.

Figure 10A:
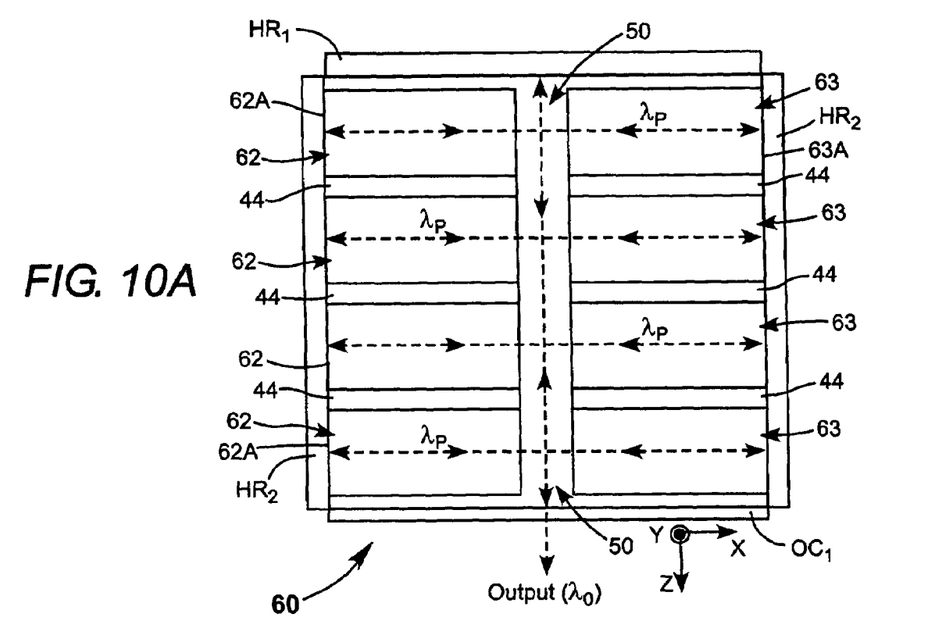
FIG. 10A is a plan view from above schematically illustrating another preferred embodiment of a wide stripe optically pumped edge-emitting laser in accordance with the present invention including a wide stripe optically-pumped edge-emitting region laterally optically pumped from two sides by a plurality of electrically-pumped regions spanning the optically pumped region and having a layer structure identical with that of the optically-pumped region.
Figure 10B:
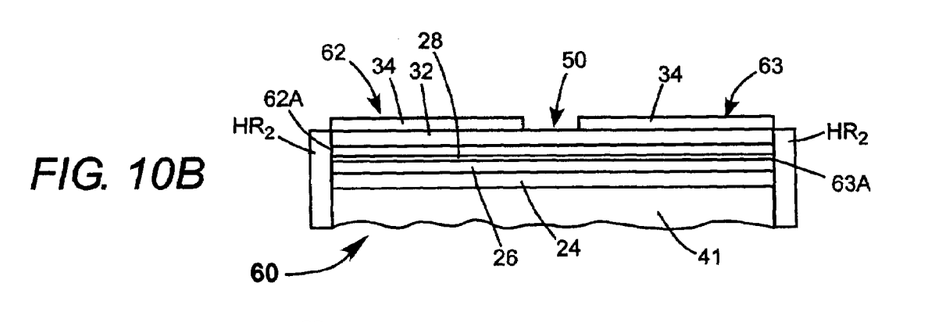
FIG. 10B is a front elevation view schematically illustrating optical continuity of the electrically pumped regions with the optically pumped regions of the laser of FIG. 10A.
Figure 10C:
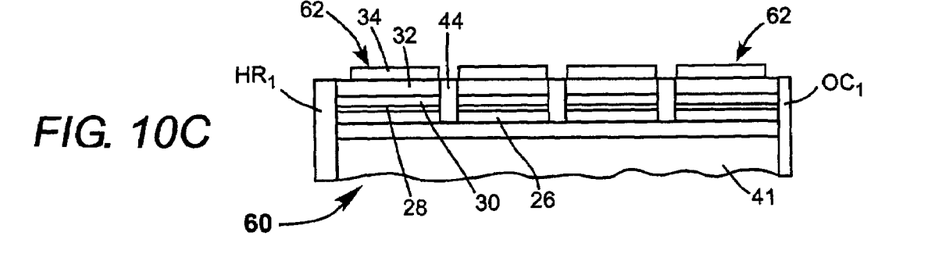
FIG. 10C is a side elevation view schematically illustrating lateral separation between the electrically pumped regions of the laser of FIG. 10A.

One potential problem of providing grooves 46 for physically separating electrically pumped regions 42 from optically pumped region 50 is that the actual reflectivity caused by a groove 46 can be difficult to predict and control. This reflectivity will be influenced, inter alia, by the width and depth of the groves and the steepness and roughness of the walls of the grooves. Another potential problem is that grooves 46 can function as lateral walls for optically pumped region 50, potentially adversely influencing the mode structure of the output radiation at wavelength $\lambda_O$. One way of avoiding these potential problems is to dispense with grooves 46 altogether. FIGS. 10A-C schematically illustrate another preferred embodiment 60 of a laser in accordance with the present invention that has an optically pumped section 50 but does not include the equivalent of a groove 46. Here a plurality of electrically pumped regions 62 are laterally separated from each other, i.e., parallel to their longitudinal axes, by grooves 44, on one side of optically pumped section 50. A plurality of similar electrically pumped regions 63 are laterally separated from each other by grooves 44, on the opposite side of optically pumped section 50. Each of the electrically pumped sections is optically continuous in the X-axis direction of laser 60 with optically pumped section 50 thereof.

A multilayer coating $HR_2$ on outward facing ends 62A of regions 62, and on outward facing ends 63A of regions 63, provides high reflectivity over a range of wavelengths on the short wavelength side of the peak of the optical gain band, and provides low reflectivity in a wavelength region including the peak gain wavelength and longer wavelengths, as discussed above with respect to laser 40 of FIGS. 4A-C. Because of this, each corresponding (opposing) pair of electrically pumped regions 62 and 63 functions as diode-laser having a resonator formed between the mirrors $HR_2$ on the outward facing ends of the electrically pumped regions. Each diode-laser generates laser radiation having a wavelength $\lambda_P$ on the short wavelength side of the peak gain wavelength. A portion of this radiation is absorbed in, and provides optical pump radiation for, optically pumped region 50. Output radiation is delivered from laser 60 via mirror $OC_1$ as in above-described laser 40.

Laser 60 is described above as having as many electrically pumped regions on either side of the optically pumped region as laser 40 in order to facilitate comparison of the two different embodiments. In this case the diode lasers formed by electrically pumped regions 62 and 63 of laser 60 will have more than twice the resonator length of the diode-lasers formed by electrically pumped regions 42 in laser 40, and, accordingly may operate with less lateral modes. Multiple lateral mode operation in a diode laser formed by electrically pumped regions 62 and 63 of laser 60 can be increased by increasing the width of the electrically pumped regions and correspondingly reducing the number of such regions on either side of optically pumped region 50. In general, the number of electrically pumped regions depicted in either laser 40 or laser 60 should not be construed as limiting the inventive laser to that number of electrically pumped regions.

In practice, a sufficient area of layers 24, 26, 28, 30 and 32 can be grown on a substrate in one growth operation to provide as many as two-thousand individual lasers. One or more lithographic etching steps is then required to provide grooves for defining the electrically and optically pumped regions of each laser on the substrate, and an additional deposition step is required to deposit electrodes 34 for the electrically pumped regions. The substrate with the layers thereon is cleaved into rectangles of the desired dimensions to provide individual laser chips. This makes it possible to produce lasers with a number of different configurations of optically and electrically pumped regions but having an essentially identical layer structure. This, in turn, enables an optimum configuration to be determined quickly by experiment.

Multilayer mirrors $HR_1$, $OC_1$, and $HR_2$ (twice) are added to the cleaved edges of the chips in separate deposition cycles. For any given laser configuration, an optimum wavelength location for the transition from low reflection to high reflection in an $HR_2$ mirror can be determined by depositing the $HR_2$ mirror on a number of laser chips of the same dimensional configuration but with chips positioned at different distances from the deposition source in the deposition apparatus.

Lasers in accordance with the present invention are described as including only one upper and one lower cladding layer, only one upper and one lower waveguide layer, and only one quantum-well layer. This is merely for convenience of description. Those skilled in the art will recognize that any of these layers can be replaced by a series of thinner sub-layers of different materials and provide a similar function in the laser heterostructure to the layer being replaced. Accordingly, in the appended claims the term layer should be interpreted to include a single layer or a series of sub layers. A detailed description of diode-laser heterostructures including such sub layers is provided in U.S. Pat. No. 5,889,805, the complete disclosure of which is hereby incorporated by reference.

In summary, the present invention is described above as a preferred and other embodiments. The invention is not limited, however, to the embodiments described and depicted. Rather, the invention is limited only by the claims appended hereto.

What is claimed is:

1. A method of making a semiconductor laser comprising the steps of:
   depositing a multilayer heterostructure on a substrate;
   etching the surface of the heterostructure to define a first region adjacent to a plurality of second regions, said second regions capable of being electrically pumped in order to generate optical radiation for pumping said first region to cause said first region to generate laser radiation, wherein the wavelength of the pump radiation is shorter than the wavelength of the laser radiation;
   coating at least one end of said first region to provide high reflectivity at the wavelength of the laser radiation; and
   coating at least one end of each of said second regions to provide high reflectivity at the wavelength of said pump radiation and low reflectivity at the laser radiation.

2. The method of claim 1, wherein said etching step is performed by etching a plurality of linear grooves in the heterostructure to define an elongated first region with the second regions being positioned to laterally deposit the optical pump radiation in the first region.

3. The method of claim 2, wherein said first region is optically pumped by radiation generated and deposited laterally into the optically pumped region by said second regions.

4. The method of claim 3, wherein said first region is configured to deliver said laser radiation as output radiation from one end of said first region.

5. The method of claim 1 wherein said reflectivity of said coating on said second regions at said wavelength of the pump radiation is greater than 99% and said reflectivity of said coating on said second regions at said wavelength of the laser radiation is less than 5%.

6. The method of claim 1, wherein the step of coating at least one end of each of said second regions includes depositing, at an end thereof furthest from said first region, a multilayer mirror.

7. The method of claim 1, wherein the step of etching the surface of the heterostructure includes defining a first plurality of second regions arranged along one side of said first region and a second plurality of second regions arranged along an opposite side of said first region.

8. The method of claim 1, wherein step of etching the surface of the heterostructure includes laterally separating each second region from any adjacent second region by a first groove formed in said heterostructure.

9. The method of claim 8, wherein each of said second regions is longitudinally separated from said first region by a second groove formed in said heterostructure.

10. The method of claim 1, wherein the step of depositing a multilayer heterostructure includes depositing a heterostructure including a quantum-well layer sandwiched between upper and lower waveguide layers, said quantum-well layer and waveguide layers being sandwiched between upper and lower cladding layers.

11. The method of claim 10, wherein each of said electrically pumped layers includes an electrode layer surmounting said upper cladding layer.

12. The method of claim 1, wherein the step of etching the surface of the heterostructure includes forming second regions that are longitudinally separated from said first region by two second grooves formed in said heterostructure, with one of said second grooves formed along one edge of said optically pumped region and the other of said second grooves formed along an opposite edge of said optically pumped region.

13. The method of claim 12, wherein each of said second regions has a laser resonator formed between said coating on one end thereof and one of said second grooves.

14. A method of making a multilayer semiconductor laser comprising the steps of:
    depositing a multilayer heterostructure on a substrate;
    etching the surface of the heterostructure to define an elongated first region having arranged along each side thereof a plurality of electrically pumped second regions, said electrically pumped regions having equal lateral spacing, with each of said electrically pumped regions on one side of said first region being aligned with a corresponding one of said electrically pumped regions on the opposite side of said first region;
    forming a first multilayer mirror for each of said electrically pumped regions at an end furthest from said elongated first region, each first multilayer mirror having a high reflectivity at a first wavelength and a low reflectivity at a second wavelength longer than said first wavelength, said aligned ones of said electrically pumped regions operable to generate laser radiation having said first wavelength and operable to circulate laterally through said first region between said first mirrors on the ends of said aligned ones of said electrically pumped regions with a portion of said circulating first wavelength radiation being absorbed in said first region in passing therethrough;
    forming a second multilayer mirror at one end of the elongated first region, having a high reflectivity at said second wavelength; and
    forming a third mirror at an opposite end of the elongated first region, the third mirror having a lower reflectivity at said second wavelength than said first mirror, said first region being optically pumped by said absorbed first-wavelength radiation whereby said optically pumped first region is operable to generate radiation having said second wavelength in response to said optical pumping, and said second wavelength radiation being operable to circulate in said optically pumped region between said second and third mirrors and be delivered as output radiation via said third mirror.

15. The method of claim 14, wherein the step of depositing a multilayer heterostructure includes forming a quantum-well layer sandwiched between upper and lower waveguide layers, said quantum-well layer and waveguide layers being sandwiched between upper and lower cladding layers.

16. The method of claim 15, wherein each of said electrically pumped regions includes an electrode layer surmounting said upper cladding layer.

17. The method of claim 16, wherein the step of etching the surface of the heterostructure forms a groove that laterally separates adjacent ones of said electrically pumped second regions.

* * * * *